United States Patent [19]

Morita

[11] Patent Number: 5,473,186

[45] Date of Patent: Dec. 5, 1995

[54] SEMICONDUCTOR DEVICE HAVING TRENCH STRUCTURE FOR ELEMENT ISOLATION REGIONS

[75] Inventor: Shigeru Morita, Fujisawa, Japan

[73] Assignee: Kabushiki Kaisha Toshiba, Kanagawa, Japan

[21] Appl. No.: 258,820

[22] Filed: Jun. 13, 1994

[30] Foreign Application Priority Data

Jun. 14, 1993 [JP] Japan ................... 5-165962

[51] Int. Cl.$^6$ ................... H01L 29/06
[52] U.S. Cl. ................... 257/519; 257/513; 257/398
[58] Field of Search ................... 257/510, 513, 257/519, 397, 398, 544, 509; 437/67

[56] References Cited

U.S. PATENT DOCUMENTS

| | | | |
|---|---|---|---|
| 4,491,486 | 1/1985 | Iwai | 257/519 |
| 5,298,450 | 3/1994 | Verret | 437/67 |

FOREIGN PATENT DOCUMENTS 3-218049  9/1991  Japan ................... 437/67

*Primary Examiner*—Robert P. Limanek
*Attorney, Agent, or Firm*—Finnegan, Henderson, Farabow, Garrett & Dunner

[57] ABSTRACT

A semiconductor device has a nobel configuration. The device includes a semiconductor substrate, element isolation regions formed on the main surface of the semiconductor substrate and at least one element region formed on the main surface of the semiconductor substrate and enclosed by the element isolation regions. In the device, the depth of each trench from the main surface to the bottom of the semiconductor substrate is shallow at a region where the trench width is less than a specified length, and it is deep at a region where the trench width is larger than the specified length.

17 Claims, 8 Drawing Sheets

SEMICONDUCTOR DEVICE HAVING TRENCH STRUCTURE FOR ELEMENT ISOLATION REGIONS

BACKGROUND OF THE INVENTION

1. Field of the Invention

The present invention relates to a semiconductor device, and, in particular, to a semiconductor device having element isolation regions and a trench structure formed on the main surface of a semiconductor substrate.

2. Description of the Prior Art

The technology of a circuit isolation element region is one important technology in the fabrication of semiconductor devices. As the trend to large scale integration and miniaturization of semiconductor devices advances, the isolation of semiconductor circuit elements is becoming more and more difficult. In order to increase the degree of integration, the method of shrinking the dimensions for circuit element isolation is an important topic, and is limited to the conventionally known LOCal Oxidation of Silicon (LOCOS) method. In order to overcome this limitation, a trench embedding element isolation structure (hereinafter, referred to as embedded element isolation) has been proposed wherein narrow openings and deep grooves (trenches) are formed in the main surface of the semiconductor substrate and $SiO_2$ or $SiO_2$ and polysilicon are embedded in these trenches. With this structure it is possible to maintain the distance between the elements in the direction of depth and to reduce the punch-through problem and the parasitic MOS transistor influence.

The fabricating process for embedded element isolation in a semiconductor device made by conventional technology and the structure will now be explained with reference to FIGS. 1A to 1E.

First, as shown in FIG. 1A, a thin oxidized film 2 is formed on the main surface of a P-type silicon semiconductor substrate 1 by a thermal oxidation method, and an $Si_3N_4$ film is formed as an insulating film 3 on the oxidized film 2.

Next, a photoresist film (omitted from the drawing) is formed as a mask by using a photolithographic etching method, and then the $Si_3N_4$ film 3 and the oxidized film 2 is selectively removed by means of RIE (Reactive Ion Etching), which become a part of element isolating regions later.

Then, as shown in FIG. 1B, the $Si_3N_4$ film 3 which has been selectively etched in this manner above and on which a specified pattern is formed, is used as a mask and a plurality of trenches 4 of specified widths W1, W2, and W3, and a specified depth D1 are formed on the underlying semiconductor substrate 1 by anisotropic etching such as RIE or the like. At this time the trenches 4 have a uniform depth D1 unrelated to the element isolation widths W1, W2, and W3.

Next, as shown in FIG. 1C, the semiconductor substrate 1 is thermally oxidized so that an oxidized film 5 is formed on the exposed inside walls of the trenches 4.

Next, P-type impurities are ion-implanted on the inner section of each trench 4 so that a diffusion region of a comparatively high concentration of P-type impurities of the same type of conductivity as the semiconductor substrate 1 is formed as a channel stopper region 6 on at least the bottom surface of the trench 4.

The channel stopper region 6 is provided to restrain punch-through phenomenon and a parasitic MOS transistor reversal within an N-type impurity diffusion region formed in the semiconductor substrate 1.

An insulating film 7 of $SiO_2$ is formed over the resulting surface to a thickness almost equivalent to the depth D2 of the trench 4, using Chemical Vapor Deposition (CVD).

Etchback is then carried out on the insulating film 7. Specifically, as shown in FIG. 1D, the $SiO_2$ insulating film 7 is etched flat from its upper portion, using mechanical abrasion or RIE or the like, until the $Si_3N_4$ insulating film 3 is exposed to form a structure wherein the $SiO_2$ insulating film 7 is embedded in the trench 4.

The accumulated thickness of the insulating film 7 is almost equivalent to the depth D2 of the trench 4 from the main surface of the semiconductor substrate 1. If the accumulated thickness is less than the depth D2 of the trench 4, the insulating film 7 does not reach as far as the edge of the trench 4 in the region where the trench 4 having the width W3 is wide, formed from the right of the drawing, therefore the insulating film 7 cannot completely cover the inside of the trench 4. The etching conditions for the $Si_3N_4$ insulating film 3 are selected so that the $Si_3N_4$ insulating film 3 acts as a self-adjusting stopper for the etching of the $SiO_2$ insulating film 7.

Next, as illustrated in FIG. 1E, the $Si_3N_4$ insulating film 3 is removed by chemical dry etching (CDE), then the thin oxidized film 2 under the $Si_3N_4$ insulating film 3 is removed using a hydrofluoric acid-related solvent so that the main surface of the semiconductor substrate 1 is exposed.

Part of the exposed surface of the semiconductor substrate 1 is used as element regions, and elements such as MOS transistors and the like are formed in these element regions in the conventional technology.

In FIG. 1E, for example, an impurity diffusion region 8 with a conductivity of a type which is the reverse of that of the semiconductor substrate 1 is formed on the exposed surface region of the main surface of the semiconductor substrate 1 using the ion-implantation method.

An element such as a MOS transistor or the like making up an integrated circuit such as a memory or logic or the like is formed here.

As explained above, with the construction of a conventional embedded element isolation region made by filling insulating film into trench formed on the surface of a semiconductor substrate, the depth of the trench from the surface of the semiconductor substrate is uniform, bearing no relation to the element isolation width. This depth is the same as the depth required in the minimum element isolation width wherein it is difficult to ensure the element isolation characteristics.

In addition, the minimum element isolation region having the width of 0.5 µm or less formed on a channel stopper 6 having a normal concentration of an impurities in the semiconductor substrate 1, the punch-through voltage in an impurity diffusion region with a conductivity which is the reverse of that of the substrate which forms the semiconductor substrate is less than the reverse voltage of a parasitic MOS transistor created in the impurity diffusion region with a conductivity which is the reverse of that of the substrate in this semiconductor substrate, therefore it is restricted by this punch-through voltage.

Specifically, in a region where the element isolation width is small, the least depth which can withstand the punch-through voltage must be ensured. In this region, if the trench is shallower than this least depth, the punch-through is not withstood, but at this least depth or deeper, the punch-through is adequately withstood.

On the other hand, as the result of every part of the trench having the same depth, this depth is greater than necessary in a region where the element isolation width is large and bears no relation to the element isolation characteristics, therefore there is a problem with the strength of the substrate. In addition, because of the necessity of embedding the insulating material in a level manner in the trench unrelated to the element isolation characteristics of this region, the formed film of embedded material must be thicker than necessary, even in regions where the trench is not required to be deep. Therefore, the amount of etching for the levelling process in the subsequent processing of the embedded material is unnecessarily increased so that the time to carry out the series of processes is increased and the machining precision is poor.

Because the thickness of the insulating film formed from the embedded material must be greater than necessary in a region with wide element isolation, the film thickness of the embedded material formed on the semiconductor substrate surface must at least be thicker than the depth of the trench after the trench is formed, in order to form a flat surface of the element isolation region on the semiconductor substrate adjacent to the region with wide element isolation and the material embedded in the last element isolation region.

SUMMARY OF THE INVENTION

Accordingly, an object of the present invention is, with due consideration to the drawbacks of such conventional semiconductor devices, to provide a novel trench structure formed on the main surface of a semiconductor substrate, together with a process whereby an embedded material is filled into this trench structure to easily provide a level structure of high precision on the main surface of a semiconductor substrate on which an element isolation region is formed.

This object is achieved in the present invention by the provision of a semiconductor device with embedded element isolation with a first feature, comprising a trench of optional width formed on a semiconductor substrate, and insulating material embedded in this trench, wherein the various depths of the trench of optional width are shallowly formed in a region where the trench is wide, and deeply formed in a region where the trench is narrow, making it possible to ensure the minimum limit of the required element isolation characteristics so that the depth suitably corresponds to the trench width.

In accordance with a preferred embodiment according to the present invention, a semiconductor device, comprises:

a semiconductor substrate;

a plurality of element isolation regions having a trench structure formed on the main surface of the semiconductor substrate; and at least one element region formed on the main surface of the semiconductor substrate and enclosed by the element isolation regions, wherein the depth of each trench from the main surface to the bottom of the semiconductor substrate is shallow at a region where the trench width is less than a specified length, and deep at a region where the trench width is larger than the specified length.

In accordance with another preferred embodiment according to the present invention, a semiconductor device comprises:

a semiconductor substrate;

an element isolation region having a trench structure formed on the main surface of the semiconductor substrate; and at least one element region formed on the main surface of the semiconductor substrate and enclosed by the element isolation regions, wherein the depth of each trench from the main surface to the bottom of the semiconductor substrate becomes deeper as the length of a line at a region where each trench is formed and the line linking the adjacent element regions which are faced to each other and the line being at right angles to the center line between the adjacent element regions, becomes shorter than a specified length In accordance with another preferred embodiment according to the present invention, a semiconductor device comprises:

a semiconductor substrate;

a plurality of element isolation regions having a trench structure formed on the main surface of the semiconductor substrate; and at least one element region formed on the main surface of the semiconductor substrate and enclosed by the element isolation regions, wherein the depth of each trench from the main surface to the bottom of the semiconductor substrate is uniform when the length of a line in a region where the trench is formed and the line links the adjacent element regions which are faced to each other and the line is at right angles to the center line between the adjacent element regions is longer than a specified length, and the depth of the trench in a region where the length of the line becomes shorter than the specified length becomes deeper.

In accordance with another preferred embodiment according to the present invention, a semiconductor device comprises:

a semiconductor substrate;

a plurality of element isolation regions having a trench structure formed on the main surface of the semiconductor substrate; and at least one element region formed on the main surface of the semiconductor substrate and enclosed by the element isolation regions, wherein the depth of each trench from the main surface to the bottom of the semiconductor substrate is a first uniform depth in a region where a line links the adjacent element regions which are faced to each other and the line is at right angles to the center line between the adjacent element regions is longer than a specified length, the depth of this trench is a second uniform length in a region where the length of the line becomes shorter than the specified length, and the second uniform length is deeper than that of the first uniform length.

In accordance with another preferred embodiment according to the present invention, a semiconductor device described above, wherein the specified length is the same or smaller than the length from the element region to a boundary point which is one half of the length of the line linking the adjacent element regions which are faced to each other and the line being at right angles to the center line between the adjacent element regions.

In accordance with another preferred embodiment according to the present invention, a semiconductor device described above, wherein the depth of each trench from the main surface to the bottom of the semiconductor substrate is determined by means of a reverse voltage of a parasitic MOS transistor created between diffused impurity regions, formed within the semiconductor substrate, having a conductivity which is the reverse of the conductivity of the semiconductor substrate in a region where the length of a line linking the adjacent element regions which are faced to each other and the line being at right angles to the center line between the adjacent element regions is longer than the specified length, and the depth of the trench is determined by means of a punch-through voltage between the diffused impurity regions in a region where the length of the line is smaller than the specified length.

In accordance with another preferred embodiment according to the present invention, a semiconductor device described above, wherein the specified length is the same as the length of a line connecting the adjacent element regions which are faced to each other, and the line being at right angles to the center line between the adjacent element regions at the boundary point between a region wherein the depth of each trench from the main surface to the bottom of the semiconductor substrate is determined by means of a reverse voltage of a parasitic MOS transistor created between diffused impurity regions, formed within the semiconductor substrate, having a conductivity which is the reverse of the conductivity of the semiconductor substrate and a region wherein the depth of each trench from the main surface to the bottom of the semiconductor substrate is determined by means of the punch-through voltage between the diffused impurities regions.

In accordance with a preferred embodiment according to the present invention, a method of fabricating a semiconductor device comprises:

a process for forming a mask providing a mask pattern by which a plurality of element regions are masked; and a process for etching by RIE, based on fixed RIE conditions, a semiconductor substrate on which the mask is formed, and forming trenches in element isolation regions in the element regions formed on the semiconductor substrate, wherein the depth of the trench from the main surface to the bottom of the semiconductor substrate formed by RIE is shallow in a region wherein the trench width is larger than a specified length, and deep in a region wherein the trench width is smaller than the specified length.

In accordance with a preferred embodiment according to the present invention, a method of fabricating a semiconductor device described above, wherein in the process for forming the trenches, a region wherein the trench width is larger than the specified length is etched, then this region is masked, after which a region wherein the trench width is smaller than the specified length is etched.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

A first embodiment will be explained with reference to FIGS. 2 to 10.

A fabrication method of the semiconductor device having a trench structure for element isolation regions as the first embodiment of the present invention will be explained.

Figure 1A:
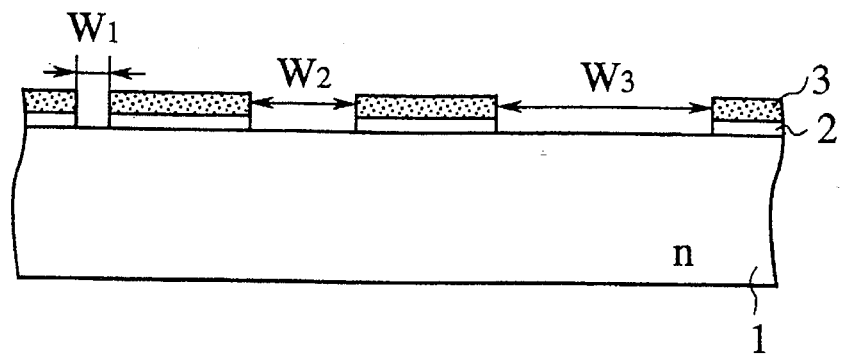
FIGS. 1A to 1E are sectional views illustrating a fabrication process for a conventional semiconductor device.
Figure 1B:
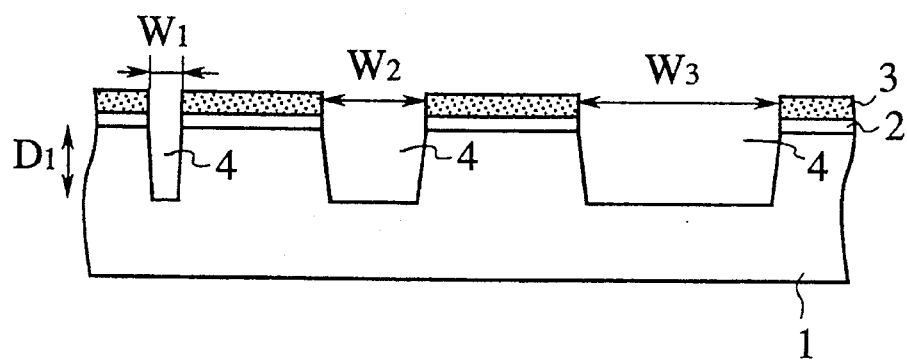
Figure 1C:
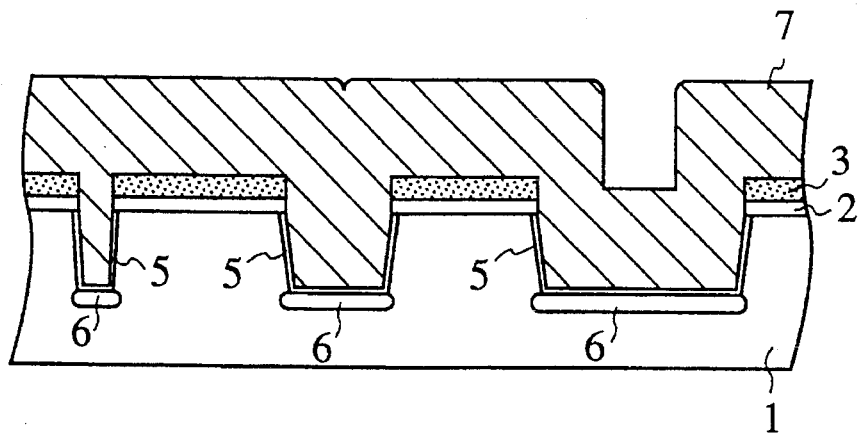
Figure 1D:
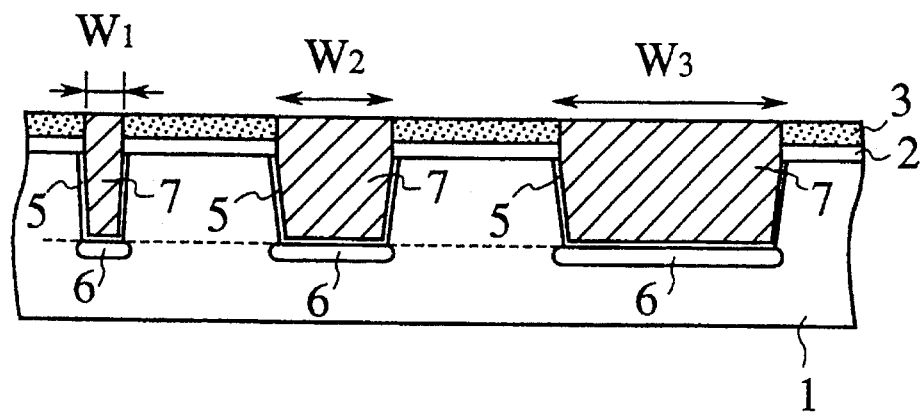
Figure 1E:
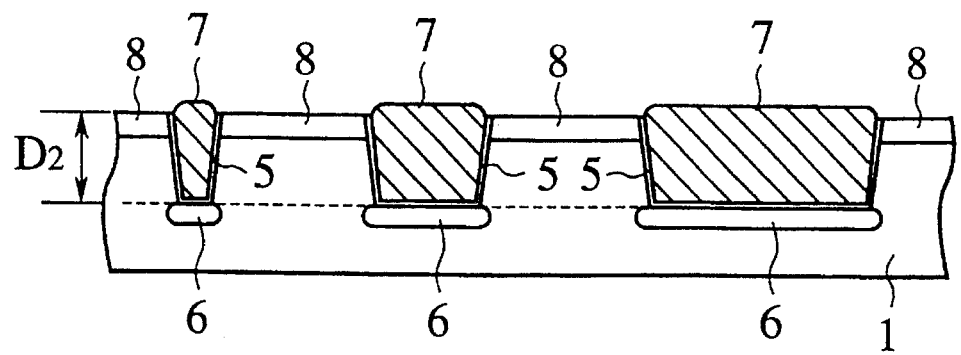
Figure 2:
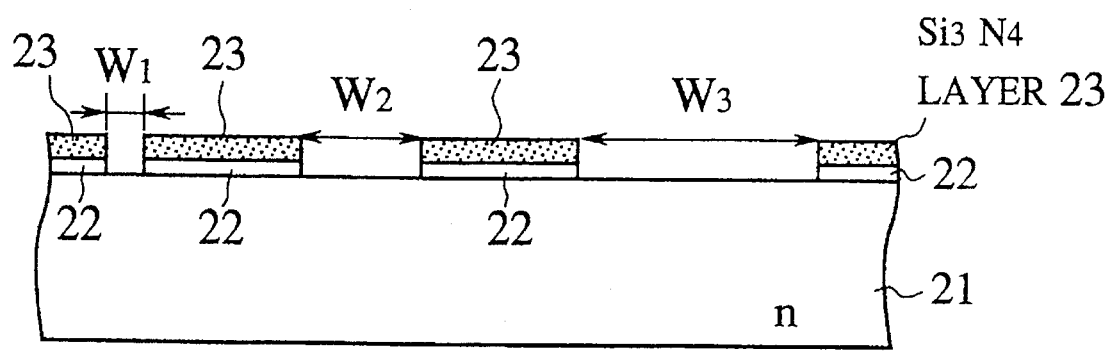
FIGS. 2 to 5 are sectional views of a semiconductor device as a first embodiment according to the present invention.

FIG. 2 is a sectional view of a semiconductor device showing the configuration of element isolation regions i.e., circuit element isolation regions, within an N-type impurity diffusion region formed in a P-type silicon semiconductor substrate 21.

A thin oxidized film 22 is formed by a thermal oxidation method on the main surface of a P-type silicon semiconductor substrate 21 with a specific resistance of 1 to 2 $\Omega$cm. An insulating film 23 in the form of, for example, a $Si_3N_4$ film is then formed on the substrate 21. It is, of course, possible to use an N-type silicon semiconductor substrate or to use a commonly known substrate of a material other than silicon in the present invention.

Figure 3:
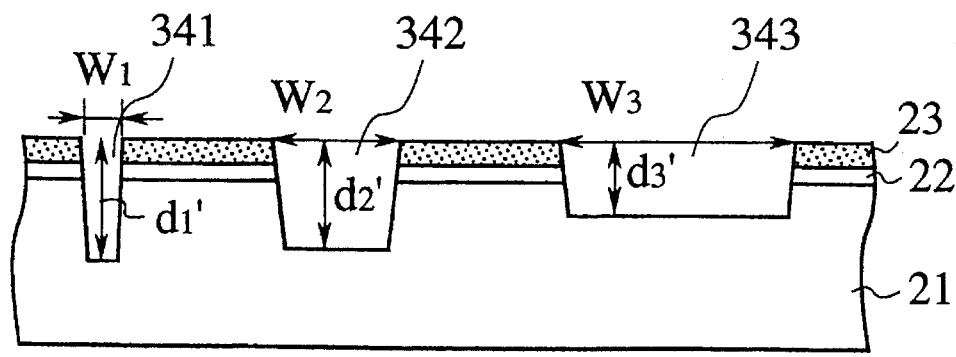

Next, using a photolithographic etching method, a photoresist film is formed as a mask by means of, for example, RIE, and a part of the $Si_3N_4$ film and the thin oxidized film ($SiO_2$) is selectively removed to form element isolation regions. Then, as shown in FIG. 3, the $Si_3N_4$ film which has been selectively etched in this manner and on which a specified pattern is formed, is used as a mask and a plurality of trenches 341, 342, and 343 of specified depths d1', d2', and d3' are formed on the underlying semiconductor substrate 21 by anisotropic etching such as RIE or the like.

Figure 4:
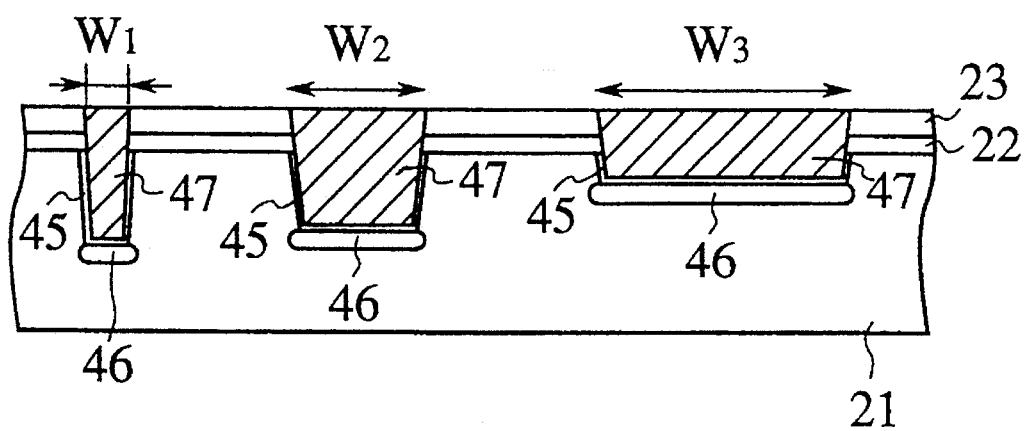

Next, as shown in FIG. 4, the semiconductor substrate 21 is thermally oxidized so that an oxidized film 45 is formed on the exposed inside walls of the trenches 341, 342, and 343.

Next, P-type impurities are ion-implanted on the inner section of each trench 341, 342, and 343 having different depths d1, d2, d3 so that a diffusion region of a comparatively high concentration of P-type impurities of the same type of conductivity as the semiconductor substrate 21 is formed as a channel stopper region 46 on at least the bottom surface of each trench 341, 342, 343.

The channel stopper region 46 is provided to restrain punch-through phenomenon and a parasitic MOS transistor reversal within an N-type impurity diffusion region formed in the semiconductor substrate 21.

An insulating film 47 of $SiO_2$ is formed over the resulting surface using Chemical Vapor Deposition (CVD).

Etchback is then carried out on the insulating film 47. Specifically, as shown in FIG. 4, the $SiO_2$ insulating film 47 is etched flat from its upper portion, using mechanical abrasion or RIE or the like, until the $Si_3N_4$ insulating film 23 is exposed to form a structure wherein the $SiO_2$ insulating film 47 is embedded in the trench 341, 342, and 343.

Figure 5:
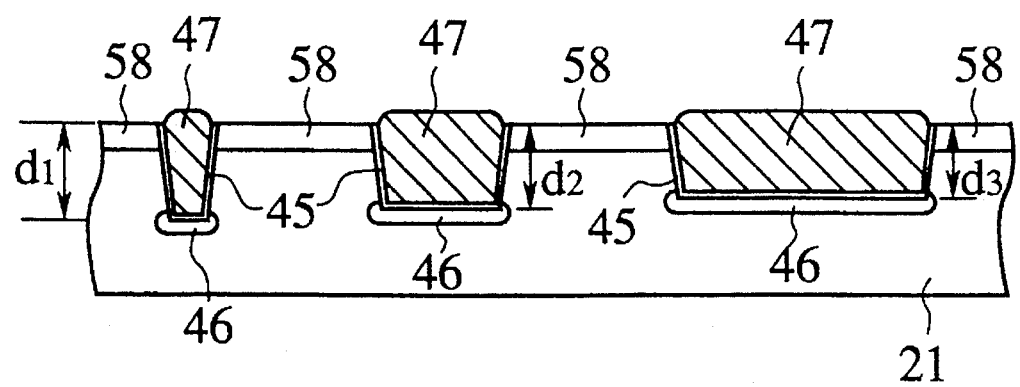

Next, as illustrated in FIG. 5, the $Si_3N_4$ insulating film 23 is removed by chemical dry etching (CDE), then the thin oxidized film 22 under the $Si_3N_4$ insulating film 23 removed is also removed using a hydrofluoric acid-related solvent so that the main surface of the semiconductor substrate 21 is exposed.

Part of the exposed surface of the semiconductor substrate 21 is used as circuit element regions 58, and circuit elements such as MOS transistors and the like are formed in these element regions in the conventional technology.

In FIG. 5, for example, an impurity diffusion region 58 with a conductivity of a type which is the reverse of that of the semiconductor substrate 21 is formed on the exposed surface region of the main surface of the semiconductor substrate 21 using the ion-implantation method. An element such as an MOS transistor or the like making up an integrated circuit such as a memory or logic or the like is formed here.

The thickness of the $Si_3N_4$ film 23 at this time is 200 nm, and that of the $SiO_2$ film 22 is 30 nm. In addition, the RIE conditions for forming the trench 341, 342, and 343 on the semiconductor substrate 21 are, etching gas HBr, gas flow rate 100 sccm, gas pressure 20 mtorr, and electrical power 500 W. Under the above-mentioned RIE conditions the etching time is set so that a trench depth of 0.3 µm results in a trench width of 4 µm.

By setting this type of RIE conditions, it is possible to automatically provide a trench depth inversely proportional to the trench width under the condition of a trench width of 1 µm or less. When the trench width is more than 1 µm, the trench depth is saturated.

Figure 10:
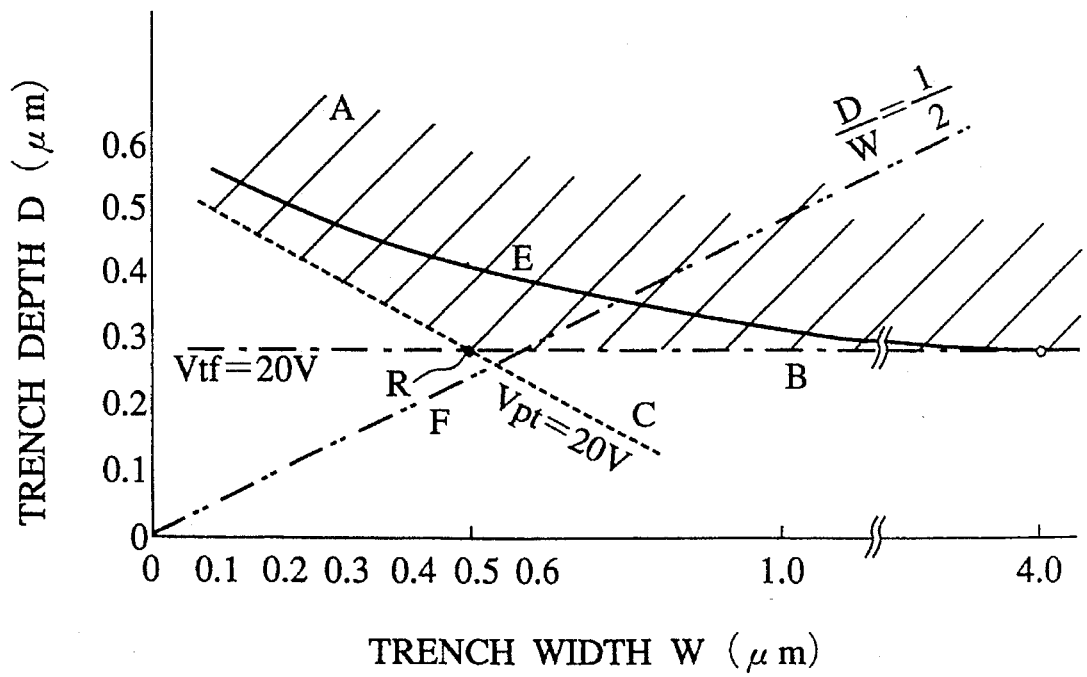
FIG. 10 is a characteristic view showing the relationship between the trench width and the trench depth for explaining the first embodiment.

The relationship of the formed trench depth to the trench width is shown by a solid curve line E in FIG. 10.

In FIG. 5, the relationship between the trench width shown in the above-mentioned sectional structure and the trench depth is in agreement with this.

As a first method of forming the trench, first, a mask is provided on the semiconductor substrate and the region where the trench is wide is etched by RIE.

Next, this mask is removed and the wide region of the trench is covered using a mask with another mask pattern. The region where the trench is narrow is then etched by RIE. The entire region in which the trench is formed is etched to the depth of the region in which the trench is wide, then, the region where the trench is wide is masked, and it is possible to etch the region in which the trench is narrow to a further depth. This method is suitable for a later-described third embodiment of the present invention.

A second method exists whereby the trench depth is automatically changed, as previously outlined, during the formation of the mask. In this method, by adjusting the RIE conditions, such as the type of gas, gas pressure, substrate temperature, and the like, in a boundary of a trench width of about 0.8 µm to 1 µm, it is possible to have the trench depth below this boundary increase automatically in proportion to the narrowness of the trench. This has merit in the case where the trench depth is successively changed.

Next, the semiconductor substrate 21 is thermally oxidized, so that an oxidized film 45 is formed on the inside wall of the exposed trenches 341, 342, 343. Following this, a P-type impurity (boron) is ion-implanted on the inside of the trench, and a P-type impurities diffused region of a relatively high concentration of the same type of conductivity as the semiconductor substrate is formed at least on the bottom surface of the trenches 341, 342, 343 as a channel stopper region 46.

The boron P-type impurities on the bottom surface of the trench are ion-implanted under conditions of a $3 \times 10^{13}$ $cm^{-2}$ dose and an acceleration voltage of 100 keV. Subsequently, the channel stopper region 46 with the high concentration of $1 \times 10^{17}$ $cm^{-3}$ P-type diffused impurities is formed at 1000° C. for 3 hours under an atmosphere of nitrogen. The channel stopper 46 is provided to restrain punch-through in the N-type impurity diffusion region formed in the semiconductor substrate 21 and reversal of the parasitic MOS transistor. Over this, an insulating film 47 made from, for example, $SiO_2$, is formed to a thickness almost corresponding to the depth of the trenches 341, 342, 343 using CVD. The insulating film 47 is then etched. By means of mechanical abrasion or etching such as RIE, the $SiO_2$ insulation film is levelly etched from the top until the $Si_3N_4$ insulation film is exposed, and a structure wherein the $SiO_2$ insulating film 47 is embedded is formed in the trenches 341, 342, 343. The accumulated thickness of the insulating film 47 on the semiconductor substrate 21 is almost the same as the depth of each trench from the main surface to the bottom surface of the semiconductor substrate 21.

In this accumulated thickness, when the trench is shallower at the wide region of the trench 343 formed from the right side of the drawing, the insulating film cannot completely fill the trench because the insulating film does not reach to the edge of the trench 4. The etching conditions are selected so that the $Si_3N_4$ insulation film acts as a self-adjusting stopper for the etching of the $SiO_2$ insulating film. Following this, the $Si_3N_4$ insulation film is removed by CDE, then the thin oxidized film under the $Si_3N_4$ insulating film is removed by means of a hydrofluoric acid-related solvent so that the main surface of the semiconductor substrate 21 is exposed.

Part of the exposed surface of the semiconductor substrate 21 is used as element regions, and elements such as MOS transistors and the like are formed in this region.

For example, an N-type impurity diffusion region 58 with a conductivity of the type which is the reverse to that of the semiconductor substrate 21 is formed on the exposed surface region of the main surface of the semiconductor substrate 21 using the ion implantation method. Here, an element such as a MOS transistor or the like forming an integrated circuit such as a memory or logic or the like is provided. Because the $SiO_2$ film 47 is filled into the trenches 341, 342, 343, the embedded $SiO_2$ film 47 is used as a mask and the impurities are ion-implanted in a self-adjusting manner, thermal diffusion is carried out, and the $N^+$ impurity diffusion region 58 is formed.

As the ion-implanting conditions used for forming the $N^+$ impurity diffusion region 58, As is the impurity, the dose is $5 \times 10^{15}$ cm$^{-2}$, and the acceleration voltage is 50 keV. The embedded material 47 of this embodiment is an SiO$_2$ film formed by the CVD method under reduced pressure. The thickness of this material matches the depth of the wide region of the trench, about 0.35 μm being suitable. This film is embedded uniformly at the film thickness of the embedded material 47, unrelated to the trench depth, by matching at the center the embedded material 47 formed on the side surfaces of the trench 341, 342, 343 in a region where the trench width is narrower than in the region where the trench depth is one-half the trench width. This material is, for example, etched back from the top by the mechanical abrasion method, and the abrasion is halted through self-adjustment at the surface of the Si$_3$N$_4$ film, so that a flat surface almost in line with an adjacent element region of the silicon semiconductor substrate 21 remains level with the surface of only the inner section of the trenches.

As the conditions for the mechanical abrasion at this time, the mechanical abrasion of the SiO$_2$ film, which is the embedded material 47, is the object, and is set so that the speed of abrasion of the Si$_3$N$_4$ film is extremely low. Following this, the Si$_3$N$_4$ film is selectively removed by CDE, and the underlying SiO$_2$ film is peeled away using NH$_4$F solvent. Subsequently, the $N^+$ impurity diffusion region 58 is formed on the surface of the silicon semiconductor substrate 21 exposed by the previous ion-implantation conditions.

Then, by means of commonly known methods, a gate electrode is formed, a layered insulation film is formed, a contact hole for drawing out the electrode is opened, and wiring for drawing out the electrode is formed, to produce the semiconductor substrate.

Further, when ion-implantation is performed to form the $N^+$ impurity diffusion region 58, there are also methods of implanting ions through the SiO$_2$ film in order to prevent disturbance of crystals formed on the surface of the silicon semiconductor substrate 21, and, as required, it is also possible to form the SiO$_2$ film prior to implanting the ions.

Figure 8:
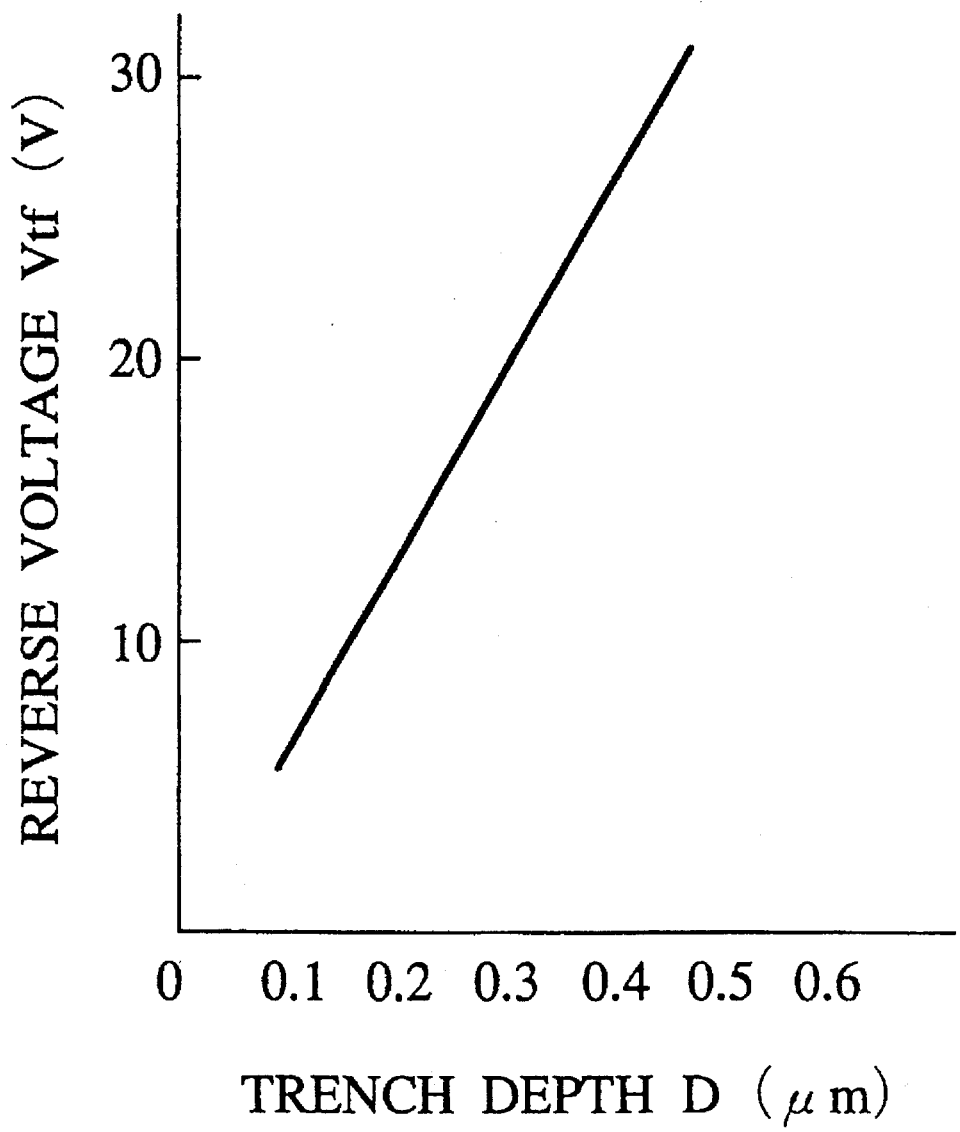
FIG. 8 is a characteristic view showing the dependency of the reverse voltage on the trench depth in the first embodiment shown in FIG. 5.

FIG. 8 is a characteristic view showing the relationship between a reverse voltage (Vtf) of a parasitic MOS transistor of the element isolation region and the depth (D) of the trench formed in the semiconductor substrate. The reverse voltage Vtf (V) is shown along the Y-axis and the trench depth D (m) along the X axis. The reverse voltage (Vtf) of the parasitic MOS transistor of the element isolation region is determined by the trench depth D and the concentration of impurities in the semiconductor substrate, in particular, by the concentration of impurities in the P-type impurities diffused region 46 at the interface with the semiconductor substrate directly under the region wherein the embedded material 47 is embedded. In the relationship of the concentration of impurities in the semiconductor substrate of this embodiment with the trench depth, as shown in the drawing, the reverse voltage Vtf is proportional to the trench depth D.

Figure 9:
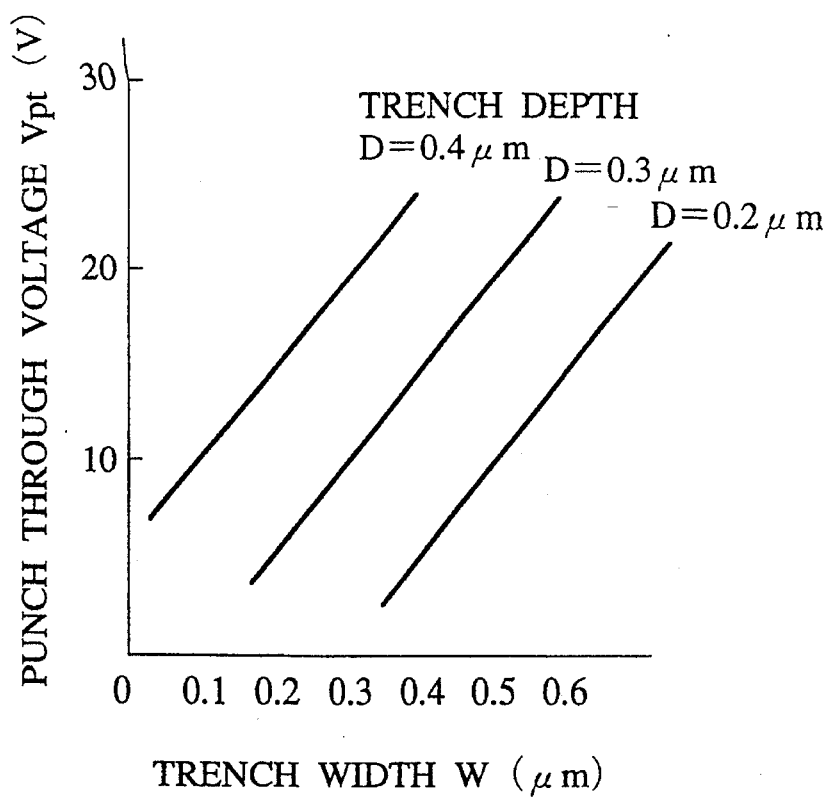
FIG. 9 is a characteristic view showing the dependency of the punch-through voltage on the trench depth in the first embodiment.

FIG. 9 is a characteristic view showing the relationship between the punch-through voltage (Vpt) in the N-type impurities diffusion region formed in the P-type semiconductor substrate and the width (W) of the trench formed in the semiconductor substrate. The punch-through voltage Vpt (V) is shown along the Y-axis and the trench width W (m) along the X axis. The punch-through voltage Vpt in the N-type impurities diffused region 8 formed in the P-type silicon semiconductor substrate is determined by the trench depth D, the trench width W, and the concentration of impurities in the semiconductor substrate, and, in particular, by the concentration of impurities in the P-type impurities diffused region 46 at the interface with the semiconductor substrate directly under the region wherein the material is embedded.

In the relationship of the concentration of impurities in the semiconductor substrate of this embodiment with the trench width, as shown in the drawing, the punch-through voltage Vpt is proportional to the trench width W at each of the trench depths D.

In the first embodiment of the present invention, no matter what the trench width, the trench depth is selected so that both the reverse voltage Vtf and the punch-through voltage Vpt are 20 V or greater.

The feature of the present invention will now be described below.

The alternate long and short dash line B in FIG. 10 shows the trench depth (W=0.3 μm) in the case where the reverse voltage Vtf obtained from FIG. 8 and FIG. 9 is 20 V at the impurity concentration for the semiconductor substrate used in the present embodiment.

The dotted line C shows the relationship between the trench depth D, at which the punch-through voltage Vpt is 20 V, and the trench width W. It can be seen that, with a trench width of 0.5 μm as a boundary, the trench depth D is regulated by the reverse voltage Vtf in the region where the trench is wide, and the trench depth D is regulated by the punch-through voltage Vpt in the region where the trench is narrow. This boundary point hereinafter will be referred to as the regulated item modification point R.

In the first embodiment, the region wherein the trench depth is D at an optional trench width W so that Vpt and Vtf are both 20 V or greater is the region A indicated by the oblique lines in FIG. 10. For the relationship between the trench depth D and the trench width W shown by the solid line E, the trench depth D is set at 0.3 μm in the region where the trench is wide, and the trench depth D is set to deepen in proportion to a reduction of the trench width from close to 4.0 μm. No matter what the trench width, the trench depth is set so that it falls in the region A. In the first embodiment, the regulated item modification point R is positioned in the region where the trench is narrower than the boundary point at which the trench depth D is one-half the trench width W.

The boundary point (the point where D/W=0.5) of the optional trench width is shown by the alternate long and two short dashes line F. The trench may also be formed according to the solid line E, and the trench depth D is set at 0.3 μm in the region where the trench is wide (for example, the trench width is more than 0.5 μm).

In the region where the trench is narrower than this, the trench depth D is set along the line shown by the dotted line C on which the punch-through voltage Vpt is 20 V. The trench may also be formed according to this setting. Specifically, it is set along the boundary of the region A. Here, the point of contact for both settings is the regulated item modification point R shown in the drawing.

SECOND EMBODIMENT

A second embodiment of the present invention will now be explained with reference to FIG. 11.

Figure 11:
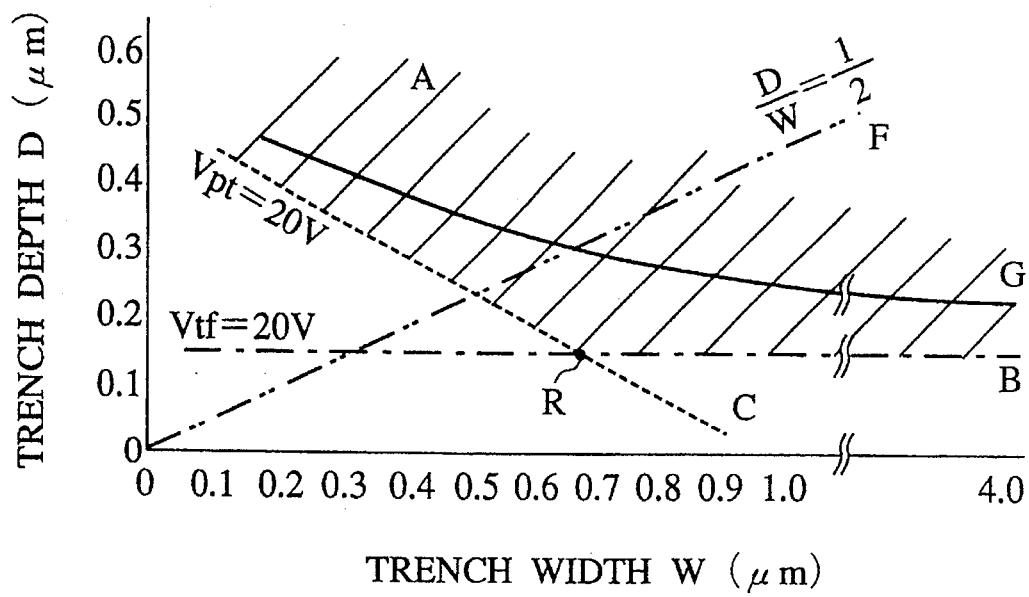
FIG. 11 is a characteristic view showing the relationship between the trench width and the trench depth for explaining a second embodiment.

FIG. 11 is a characteristic view showing the relationship between the trench width W and the trench depth D. The details of the cross-sectional structure and the fabrication process for this embodiment are almost the same as for the first embodiment, therefore further explanation is omitted here.

The point of difference between this second embodiment and the first embodiment described above is in the process for forming the highly concentrated P-type impurities diffused region (channel stopper) 46 formed on the bottom surface of the trench. Boron, as the impurity, is ion-implanted under conditions of a $6 \times 10^{13}$ cm$^{-2}$ dose and an acceleration voltage of 100 keV. Subsequently, the channel stopper region 46 set at an impurity concentration of $2 \times 10^{17}$ cm$^{-3}$ is formed at 1000° C. for 3 hours under an atmosphere of nitrogen, using a high temperature thermal process.

This impurity concentration is higher than that used for the first embodiment. Therefore, the minimum trench depth D which ensures both a reverse voltage Vtf and a punch-through voltage Vpt of 20 V is shifted shallower than in the first embodiment. Namely the minimum trench depth is 0.15 µm shown in FIG. 11 which is shorter than the minimum trench depth shown in FIG. 10. Further, the regulated item modification point R for making the variation in Vtf greater than in Vpt is positioned in the region where the trench width W is greater than at the boundary point where the trench depth D is one-half the trench width W. The trench depth at the above-mentioned wide region is not 0.15 µm which ensures the lower limit of Vtf, but is set at almost 0.25 µm, at which the trench depth is regulated at a Vpt=20 V at the boundary where the trench depth is one-half the trench width.

Specifically, the trench formation is implemented according to the solid curve line G. In this embodiment, the formed film thickness of the embedded material is 0.25 µm.

THIRD EMBODIMENT

A third embodiment of the present invention will now be explained with reference to FIG. 12.

Figure 12:
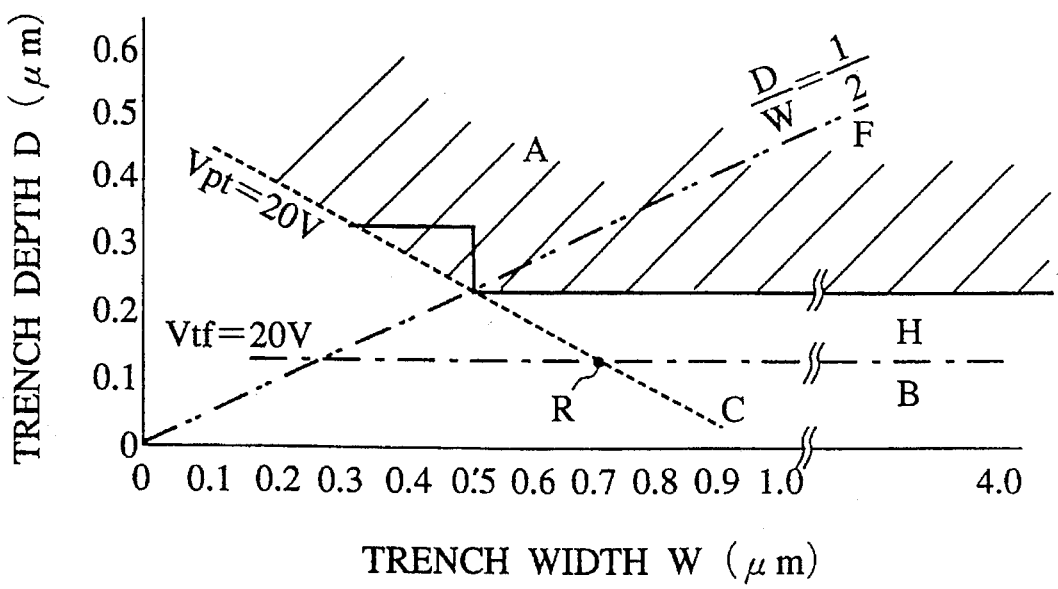
FIG. 12 is a characteristic view showing the relationship between the trench width and the trench depth for explaining a third embodiment.

FIG. 12 is a characteristic view showing the relationship between the trench width W and the trench depth D. The details of the cross-sectional structure and the manufacturing process for this embodiment are almost the same as for the first embodiment, therefore further explanation is omitted here. The point of difference between this third embodiment and the first and second embodiments is in the method of forming the trench. Specifically, the RIE conditions for the silicon semiconductor substrate are, in particular, selected so that it is possible to ensure a uniform depth without relation to the trench width. Accordingly, RIE can be implemented at a uniform etching speed.

Furthermore, by combining two different RIE process for a silicon semiconductor substrate and the double masking using a photoresist or the like, the boundary point (the point regulated to Vpt=20 V at the boundary where the trench depth is one-half the trench width) of a trench width of 0.5 µm is demarcated, and from this, the respective etchings are performed separately at a region wider than a region where the trench is narrow. Here, the trench depth D is not changed to correspond to the trench width W (this is different from the first and second embodiments), but there are two types of depths at the borderline of the previous boundary point R shown in FIG. 12.

At this time, the trench depth at a trench width of 0.5 µm or less is set at 0.35 µm which is regulated by a Vpt=20 V at a minimum design rule (minimum trench width of 0.3 µm) for this semiconductor substrate. At a trench width of 0.5 µm or more, the trench depth is set at 0.25 µm which is regulated by Vpt=20 V at the boundary point where the trench depth is one-half the trench width. Specifically, the trench is formed according to the solid line H. In this embodiment the formed film thickness of the embedded material is 0.25 µm. As previously outlined, in the region where the trench width is greater than at the boundary point where the trench depth is one-half the trench width, the necessary formed film thickness of the embedded material is determined by the trench depth for levelness. In the first embodiment, because the regulated item modification point is positioned at the region side where the trench is narrower than the boundary point, the trench depth can be set at the minimum depth which is determined by the reverse voltage Vtf, uniformly crossing the region where the trench is wide from the region where the trench is narrower than this boundary point.

In the second embodiment shown in FIG. 11, because the regulated item modification point R is positioned on the region side where the trench wide is wider than the boundary point, even when the trench depth in the region where the trench is wide is set at the minimum depth which is determined by the reverse voltage Vtf, only a formed film thickness of the embedded material which can be embedded in the trench depth determined by the punch-through voltage Vpt at the above-mentioned boundary point is necessary. The part of the trench depth above this point does not contribute to a shortening of the forming time or the abrasion time, or an improvement in the abrasion precision. Accordingly, in such a case, when there is agreement, of the trench depth in a region where the trench is wide, with the trench depth determined by the punch-through voltage Vpt at the boundary point, protrusions produced during the formation of the embedded material for the wide trench region can be avoided, and conversely, there is the advantage that there is no worsening of the levelling precision.

In addition, this effect is also provided with a structure wherein a trench depth, as in the third embodiment, is made uniformly shallow determined by the punch-through voltage (Vpt) at the boundary point of the region where the trench is wider than at the boundary point, and wherein the trench is of a uniform depth determined by the punch-through voltage Vpt at the minimum trench width used with this semiconductor device, at a region which is narrower than the boundary, even when not using the RIE process for the silicon semiconductor substrate under the special conditions when the depth of a trench is becomes deep in proportion to the narrowing of the trench width as in the first embodiment and the second embodiment.

As shown in FIGS. 2 to 12 of the first, second, and third embodiment of the semiconductor device, a trench adjusted to a depth at which an optional region on the semiconductor substrate conforms to the element isolation characteristics is suitably constructed, making it possible to increase the substrate strength, and an embedding material is filled into this trench so that a highly precise level structure is easily provided on the main surface of the semiconductor substrate on which the element isolation regions has been formed.

Also, the shallowest depth of each trench from the main surface to the bottom of the semiconductor substrate (hereinafter, the trench depth) in a region in which the length (hereinafter, then trench width) of a line, which is at right angle to a center line 11 and which connects two adjacent element regions which are faced to each other is determined from a punch-through voltage between diffused regions with a conductivity which is the reverse of the conductivity of the semiconductor substrate (hereinafter referred to as a punch-through voltage (Vpt)).

In particular, in order that the concentration in the semiconductor substrate positioned under the trench is free from the trench width and the same voltage-resistant is kept, the relationship between the trench width and the trench depth described above have to be considered because the trench depth determined from a reverse voltage of a parasitic MOS transistor (hereinafter, reverse voltage (Vtf)) is normally more shallow than the trench depth determined from the punch-through voltage.

Under such conditions, it is necessary to make the surface of the material embedded in the finally formed element isolation region a series of surfaces level with the element region adjacent to the semiconductor substrate surface, as outlined below.

FIG. 5 is a cross sectional view of a semiconductor device as the first embodiment which is finally formed.

Figure 6:
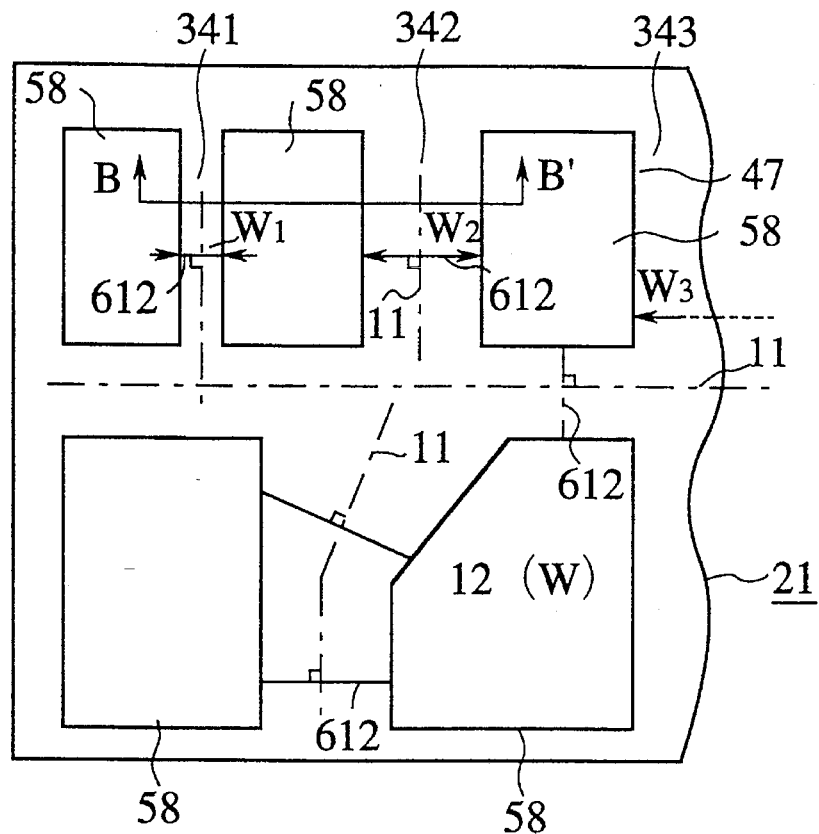
FIG. 6 is a plan view of a semiconductor device for the first embodiment according to the present invention.

FIG. 6 is a top view or a plane view of the main surface of the semiconductor device shown in FIG. 5.

Figure 7:
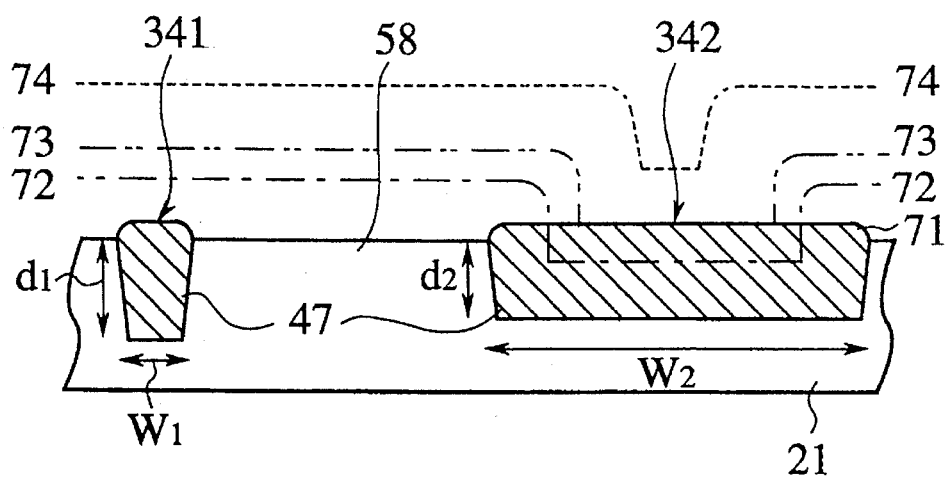
FIG. 7 is a sectional view taken across a section B—B' of the semiconductor device of FIG. 6 for explaining the present invention.

FIG. 7 is the cross sectional view along the B—B' line shown in FIG. 6.

As shown in FIG. 7, the depths d1, d2 of the trenches 341, 342 are the distance from the main surface of the semiconductor substrate 21 to the bottom of each trench within the semiconductor substrate 21. The trench widths W1, W2 represent the distances within the faced element regions 58 which is at right angles to a center line 11 in an adjacent element regions 10 and linking the opposite side of the element regions 10.

In order that the adjacent element regions 10 and the upper surface of the embedded material 47 last embedded in the element isolation regions are formed on a same level of the main surface of the semiconductor device 21, the film thickness of the embedded material 47 formed on the surface of the semiconductor device 21 after formation of the trenches 241, 342 is determined based on the maximum depth of a wide trench region in which a ratio (aspect ratio) of the trench depth D and the trench wide W (W1, W2) is less than 0.5 from the aspects of precision of levels, reduction of processing, and labor reduction in a wide trench. For this reason, an optimum film thickness 73, as shown in FIG. 7, is selected for the embedded material formed on the surface of the semiconductor substrate 21.

Specifically, when the embedded material 47 is formed, the film thickness of the embedded material 47 must be about as thick as the trench, no matter what the width of the trench.

Also, it is efficient to use the thinnest film possible when the embedded material 47 is formed from the aspect of etching precision and reduction of etching time in an etching process for removing the projecting embedded material 47 so that the embedded material 47 remains only in the trench 241, 242, 243.

As shown in FIGS. 7, in a region 341 in which the aspect ratio of the trench is 0.5 or greater, the embedded material is embedded levelly in the trench even when the formed film thickness is the depth of the trench or less. In a region 342 in which the aspect ratio of the trench is 0.5 or less, when the embedded material is formed to a film thickness 72 shown in FIG. 7 which is less than the trench depth D, a step is produced in the center.

Conversely, when the embedded material is formed to a film thickness 74 shown in FIG. 7 which is thicker than necessary, an increase in the processing time and a worsening of etchback precision is incurred. In a region where the trench is wide and the aspect ratio is 0.5 or less, when the trench depth corresponding to the trench width is changed, with a trench of greater than maximum depth, from the time the embedded material is already accumulated, the etchback precision is worsened because the embedded material is higher than the adjacent element region.

Accordingly, in the present invention, when the trench depth is one-half the trench width or greater at a boundary point where a trench depth determined from the punch-through voltage is identical to the trench depth determined from the reverse voltage in the semiconductor substrate, this trench depth is taken as a uniform trench depth determined from the above-mentioned reverse voltage.

When the trench depth is less than one-half the trench width at this boundary point, a trench depth greater than this trench width is taken as a trench depth equal to that determined from the punch-through voltage at the boundary point, and is standardized at the necessary maximum depth, for a region with a large trench width and an aspect ratio of 0.5 or less. It is therefore possible to control the deviation in the level shape of the embedded material.

As can be seen by the foregoing explanation, in the present invention, an optimum trench is provided which has element isolation characteristics, so that it is possible to obtain a semiconductor device with high substrate strength. In addition, the optimum value for levelness of the formed film thickness of the embedded material can be determined only at the trench depth in the region where the trench is wide. Accordingly, a uniform depth can be provided unrelated to the trench depth, or embedding of the embedded material in an excessively deep trench, which is necessary in a conventional trench structure wherein the trench is deep in a region where the trench is wide, becomes unnecessary, so that the formation time for the embedded material is reduced, and the amount of abrasion for levelling the embedded material can be reduced, therefore the time required for abrasion is shortened and it is possible to improve the abrasion precision.

What is claimed is:

1. A semiconductor device comprising:

a semiconductor substrate having therein a main body of a first conductivity type;

the main body having the following diffusion regions formed therein:

a first diffusion region elongated in a first direction which is parallel to a surface of the semiconductor substrate; the first diffusion region having the first conductivity type, having a high impurity density which is higher than an impurity density of the main body, and having a width $l1$ and a depth $d1$ from the surface of the semiconductor substrate;

a second diffusion region elongated in the first direction; the second diffusion region having the first conductivity type, having a high impurity density which is higher than the impurity density of the main body, and having a width $l2$ and a depth $d2$ from the surface of the semiconductor substrate; and a third diffusion region elongated in the first direction; the third diffusion region having the first conductivity type, having a high impurity density which is higher than the impurity density of the main body, and having a width $l3$ and a depth $d3$ from the surface of the semiconductor substrate, wherein the widths $l1$, $l2$, and $l3$, and the depths $d1$, $d2$, and $d3$ have the following relationships:

$$d1 > d2 > d3,$$

and $$l1 < l2 < l3.$$

2. A semiconductor device as claimed in claim 1, wherein the semiconductor substrate has:

a first trench formed between the surface of the semiconductor substrate and the first diffusion region;

a second trench formed between the surface of the semiconductor substrate and the second diffusion region;

a third trench formed between the surface of the semiconductor substrate and the third diffusion region.

3. A semiconductor device as claimed in claim 2, wherein a filler of $SiO_2$ or $SiO_2$ and polysilicon is filled in each of the first trench, the second trench, and the third trench.

4. A semiconductor device as claimed in claim 1, wherein the first conductivity type is an N conductivity type.

5. A semiconductor device comprising:

a semiconductor substrate of a first conductivity type having a surface;

a first diffusion region elongated in a first direction which is parallel to the surface of the semiconductor substrate; the first diffusion region having the first conductivity type, having a high impurity density which is higher than an impurity density of the semiconductor substrate, and having a width l4 and a depth d4 from the surface of the semiconductor substrate;

a second diffusion region elongated in the first direction; the second diffusion region having the first conductivity type, having a high impurity density which is higher than the impurity density of the semiconductor substrate, and having a width l5 and a depth d5 from the surface of the semiconductor substrate; and a third diffusion region elongated in the first direction; the third diffusion region having the first conductivity type, having a high impurity density which is higher than the impurity density of the semiconductor substrate, and having a width l6 and a depth d6 from the surface of the semiconductor substrate, wherein the widths l4, l5, and l6, and the depths d4, d5, and d6 have the following relationships:

$$d4>d5>d6,$$

and $$l4<l5<l6.$$

6. A semiconductor device as claimed in claim 5, wherein the semiconductor substrate has:

a first trench formed between the surface of the semiconductor substrate and the first diffusion region;

a second trench region formed between the surface of the semiconductor substrate and the second diffusion region; and a third trench region formed between the surface of the semiconductor substrate and the third diffusion region.

7. A semiconductor device as claimed in claim 5, wherein a filler of $SiO_2$ or $SiO_2$ and polysilicon is filled in each of the first trench, the second trench, and the third trench.

8. A semiconductor device comprising:

a semiconductor substrate of a first conductivity type having:

a first trench having a width W4 and a depth d7;

a second trench having a width W5 and a depth d8; and a third trench having a width W7 and a depth d9, wherein the widths W4, W5, and W6 and the depths d7, d8, and d9 have the following relationships:

$$W4>W5>W6,$$

and $$17<18<19.$$

9. A semiconductor device as claimed in claim 8, wherein the semiconductor substrate further has:

a first channel stopper of an impurity diffusion region of a high impurity density which is higher than an impurity density of the semiconductor substrate, the first channel stopper being formed under the first trench;

a second channel stopper of an impurity diffusion region of a high impurity density which is higher than the impurity density of the semiconductor substrate, the second channel stopper region being formed under the second trench;

a third channel stopper of an impurity diffusion region of a high impurity density which is higher than the impurity density of the semiconductor substrate, the third channel stopper region being formed under the third trench.

10. A semiconductor device as claimed in claim 9, wherein a conductivity type of each of the first channel stopper, the second channel stopper, and the third channel stopper is the first conductivity type.

11. A semiconductor device as claimed in claim 9, wherein the conductivity type of the semiconductor substrate and each of the first channel stopper, the second channel stopper, and the third channel stopper is the P type.

12. A semiconductor device as claimed in claim 9, wherein each of the first trench, the second trench, and the third trench has a side wall region and a bottom region, and a space in each trench formed by the side wall region and the bottom region is filled with a filler which is $SiO_2$ or $SiO_2$ and polysilicon.

13. A semiconductor device comprising:

a semiconductor substrate of a first conductivity type having:

a first region in which a first circuit element is formed;

a second region in which a second circuit element is formed;

a third region in which a third circuit element is formed; and a fourth region in which a fourth circuit element is formed; wherein a first trench having a width W7 and a depth d10 is formed between the first region and the second region to isolate electrically the first region and the second region, a second trench having a width W8 and a depth d11 is formed between the second region and the third region to isolate electrically the second region and the third region, a third trench having a width W9 and a depth d12 is formed between the third region and the fourth region to isolate electrically the third region and the fourth region; and wherein the widths W7, W8, and W9 and the depths d10, d11, and d12 have the following relationships:

$$W7>W8>W9,$$

and $$d10<d11<d12.$$

14. A semiconductor device comprising:

a semiconductor substrate having a main surface;

the semiconductor substrate having a plurality of trenches for electrically isolating a plurality of semiconductor circuit elements;

each semiconductor circuit element formed between adjacent trenches, and each trench having a trench width and a trench depth; and wherein the trench depth from the main surface of the semiconductor substrate to a bottom of each trench is shallow where the trench width is less than 0.5 micrometer, and deep where the trench width is larger than 0.5 micrometer.

15. A semiconductor device comprising:

a semiconductor substrate having a main surface;

the semiconductor substrate having a plurality of trenches extending inwardly from the main surface and forming a plurality of element isolation regions for electrically isolating semiconductor circuit elements;

each semiconductor circuit element formed in an associated element isolation region between adjacent trenches, and each trench having a trench width and a trench depth;

wherein the trench depth of each trench becomes deeper as the length of a line, which links adjacent circuit elements faced toward each other and which is at right angles to a center line between the adjacent circuit elements, becomes shorter.

16. A semiconductor device comprising:

a semiconductor substrate having a main surface;

the semiconductor substrate having a plurality of trenches extending inwardly from the main surface and forming a plurality of element isolation regions for electrically isolating semiconductor circuit elements;

each semiconductor circuit element formed in an associated element isolation region between adjacent trenches, each trench having a trench width and a trench depth; and wherein the trench depth of each trench is uniform when the length of a line, which links adjacent circuit elements faced toward each other and which is at right angles to a center line between the adjacent circuit elements, is longer than 0.5 micrometer, and wherein the trench depth of each trench is deeper than the uniform depth when the length of the line is shorter than 0.5 micrometer.

17. A semiconductor device comprising:

a semiconductor substrate having a main surface;

the semiconductor substrate having a plurality of trenches extending inwardly from the main surface and forming a plurality of element isolation regions for electrically isolating semiconductor circuit elements, each trench having a trench width and a trench depth; and wherein the trench depth of each of first trenches is a first fixed depth when a line which links adjacent circuit elements faced toward each other and which is at right angles to a center line between the adjacent element regions is longer than 0.5 micrometer, and the trench depth of each of second trenches is a second fixed depth when the length of line is shorter than 0.5 micrometer, and the second fixed depth is deeper than that of the first fixed depth.

* * * * *